ers (128, 132) are also included for adjusting the modulation of the PLL (120) when in the transmit mode.

United States Patent [19]
Hansen et al.

[11] Patent Number: 4,969,210
[45] Date of Patent: Nov. 6, 1990

[54] TWO-WAY RADIO HAVING A PLL

[75] Inventors: Kenneth A. Hansen, Bedford, Tex.; Ralph T. Enderby, Sunrise, Fla.

[73] Assignee: Motorola, Inc., Schaumburg, Ill.

[21] Appl. No.: 154,550

[22] Filed: Feb. 10, 1988

[51] Int. Cl.$^5$ .............................................. H04B 1/40
[52] U.S. Cl. ...................... 455/188; 455/216; 455/192; 455/266; 455/260
[58] Field of Search ............... 455/216, 188, 192, 176, 455/199, 266, 76, 77, 75, 84, 86, 260, 255, 258, 183

[56] References Cited

U.S. PATENT DOCUMENTS

| | | | |
|---|---|---|---|
| 4,061,973 | 12/1977 | Reimers et al. | 455/77 X |
| 4,353,038 | 10/1982 | Rose et al. | |
| 4,395,776 | 7/1983 | Naito et al. | 455/76 X |
| 4,450,583 | 5/1984 | Strobel et al. | 455/86 |
| 4,504,800 | 3/1985 | Plouviez | |
| 4,528,522 | 7/1985 | Matsuura | 455/77 X |
| 4,633,511 | 12/1986 | Koga et al. | 455/86 |
| 4,654,859 | 3/1987 | Kung et al. | 455/76 X |

Primary Examiner—Douglas W. Olms
Assistant Examiner—Ralph Smith
Attorney, Agent, or Firm—Thomas G. Berry

[57] ABSTRACT

A method and arrangement for electronically band-switching a radio (100) is described which includes at least a receiver (110, 111), a PLL (120), and a fully synchronized, programmable counter as a frequency divider (140) that is coupled between the receiver and the PLL. This fully synchronized divider (140) provides an output signal (143) at a lower frequency with minimal harmonic energy and improves the sideband noise performance as the divisor increases. When the radio also includes a transmitter (104), stepped attenuators (128, 132) are also included for adjusting the modulation of the PLL (120) when in the transmit mode.

The PLL includes at least a reference signal generator (121, 122), a phase detector (124), and a voltage controlled oscillator (127) having an output (129) coupled, via a feedback path, to a second input (131) of the phase detector (124). The fully synchronized, programmable frequency divider includes at least a counter, a data loader, a half-period detector, and a synchronizer which are configured and arranged to provide an output signal (143) having a duty cycle, nearly equal to 50%, which is independent of a divisor and which simplifies the filtering requirements thereafter, thereby providing electronic bandswitching for the radio while exhibiting fast-locking and low-noise characteristics.

15 Claims, 2 Drawing Sheets

200

TWO-WAY RADIO HAVING A PLL

RELATED APPLICATIONS

This case is related to U.S. Pat. No. 4,981,825 Fully Synchronized Programmable Counter With A Near 50% Duty Cycle Output Signal, and filed Feb. 9, 1989 as patent application Ser. No. 07/154,160. The teachings of U.S. Pat. No. 4,981,825 are incorporated herein by reference. Each of these applications is assigned to the assignee of the present invention.

BACKGROUND OF THE INVENTION

This invention relates to radio transceivers. In particular, it relates to a method and means of using a fully synchronized programmable counter with a near 50% duty cycle output signal as a frequency divider to provide electronic bandswitching as well as channel frequency selection for a transmitter and receiver path in a radio transceiver.

Two-way radio communications are generally carried out using an associated pair of frequencies within one or more bands. (Such pairs are often referred to as a "channel"). Thus, when a transceiver operates in a particular channel, it must generate at least one frequency for transmission and at least one frequency with which to mix a received signal to produce a fixed intermediate frequency signal.

Modern communication systems require more efficient use of the limited and congested radio spectrum, and therefore utilize high-speed data and elaborate signalling schemes to achieve greater message signal throughput. Such signalling schemes, however, demand better performance from the transmitter and receiver when changing modes between transmit and receive, and when changing between channels. These radios must achieve phase-lock quickly and must maintain an accurate carrier frequency with low-noise, and minimal jitter.

despite this need, however, radios have historically been configured to cover relatively narrow bands of frequencies, say 45-50 MHz, or about 10% bandwidth. Today, however, there is a need to switch across wider bands of frequencies. This presents particularly difficult design problems, whether attempting to operate at lower carrier frequencies, such as 30-50 MHz (low-band), or between different bands (i.e., low-band and 150 MHz, high-band). This is because, by conventional methods, the radio's VCO must cover almost an octave of frequencies. In addition, the design and construction of such a VCO operating at a low frequency is made more difficult when wide modulation bandwidth and low-noise performance are needed simultaneously. Thus, conventional VCOs are limited to a specific, narrow range of frequencies or are otherwise compromised in overall performance, particularly for mobile radio applications.

SUMMARY OF THE INVENTION

It is an object of the present invention to provide an improved bandswitching method and arrangement for a radio, including at least a receiver and a phase-locked loop (PLL), which overcomes the foregoing deficiencies.

It is a further object of the present invention to provide an improved bandswitching method and arrangement for a radio transceiver, having a PLL of the foregoing type, which utilizes a fully synchronized, programmable counter having a near 50% duty cycle output signal and minimal filtering thereafter, to provide electronic bandswitching for the radio while exhibiting fast-locking and low-noise characteristics.

In practicing one form of the present invention, a radio is described which includes at least a receiver, PLL, and a fully synchronized, programmable counter as a frequency divider that is coupled between the receiver and the PLL. The radio may be a transceiver, having a transmitter, in which case stepped attenuators are also included for adjusting the modulation of the PLL when in the transmit mode. The transceiver may include a signal transmitting path and a signal receiving path, with each path having wide-bandwidth frequency coverage encompassing at least two frequency bands, or may include a plurality of such transmitting paths and receiving paths, one for each of the multiple bands.

The PLL in the two-way radio includes at least a reference signal generator, a phase detector, and a voltage controlled oscillator having an output coupled, via a feedback path, to an input of the phase detector. The fully synchronized, programmable frequency divider includes at least a counter, a data loader, a half-period detector, and a synchronizer which are configured and arranged to provide an output signal having a duty cycle nearly equal to 50% which is independent of a divisor that may be synchronously changed upon command, thereby providing electronic bandswitching for the multi-frequency two-way radio while exhibiting fast-locking and low-noise characteristics.

These and other objects of the present invention will become apparent to those skilled in the art upon consideration of the accompanying specification, claims, and drawings.

DETAILED DESCRIPTION OF THE PREFERRED EMBODIMENT

Figure 1:
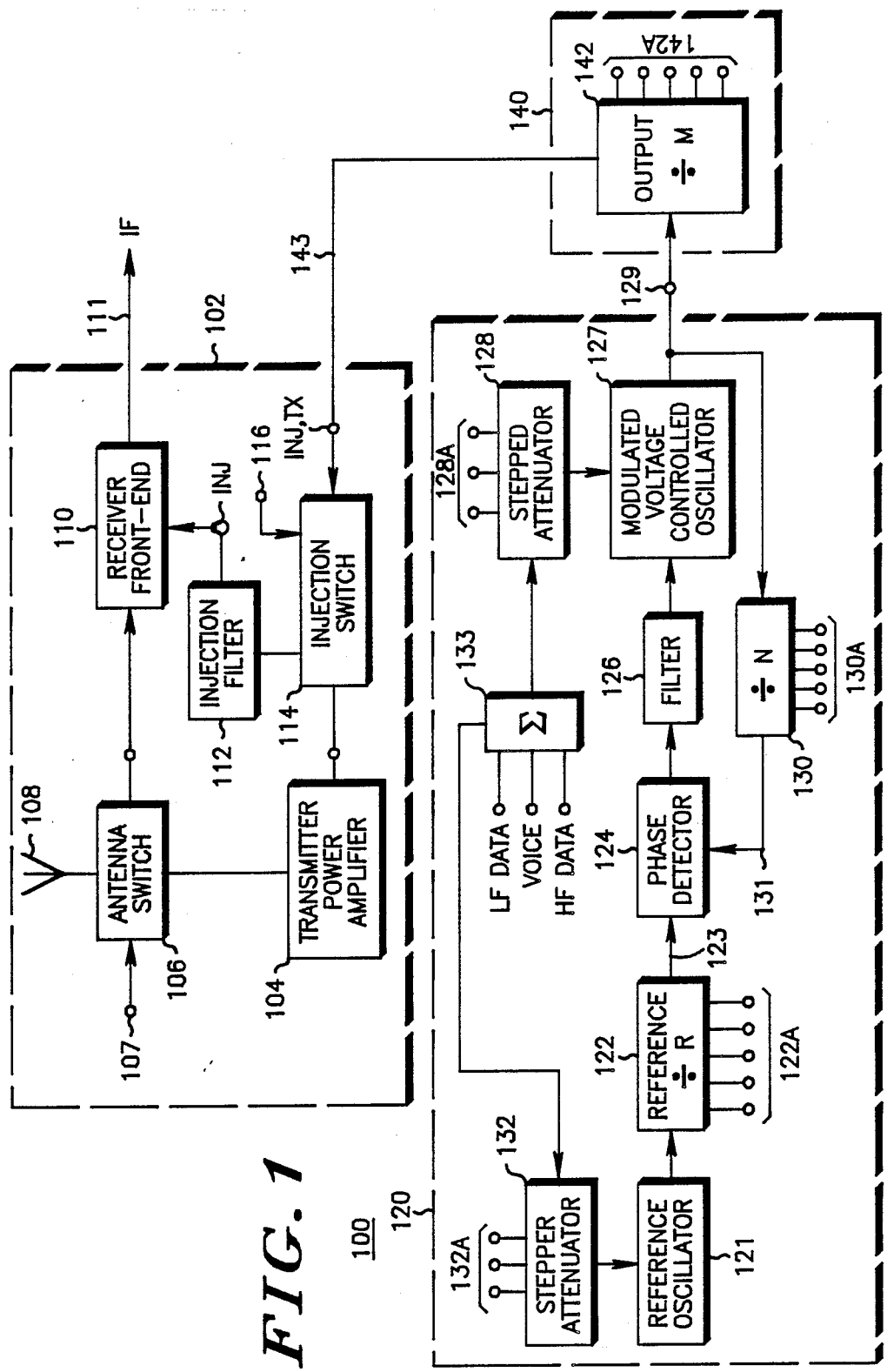
FIG. 1 is a block diagram of a two-way radio embodying the present invention.

FIG. 1 depicts a block diagram of a two-way radio (100) which accommodates the method and arrangement of the present invention. Included is multi-band transceiver (102), a PLL (120), and a fully synchronized programmable frequency divider (140), which couples the output of the PLL (120) to the multi-band transceiver (102), as shown.

Multi-band transceiver (102) includes a single transmitting path (represented by power amplifier (104)), antenna switch (106), antenna (108), a single receiving path (represented by front-end (110)), an injection filter (112), and an injection switch (114), as shown.

within transceiver (102), transmitting path (104) comprises, as shown, a single transmitting path having wide-bandwidth frequency coverage, suitable for covering at least two frequency bands. Alternatively, it may include a plurality of transmitting paths (not shown), one for each of the multiple bands. Antenna switch (106) includes control terminal (107) for effecting alternate coupling of the antenna (108) to either the transmitter PA within transmitting path (104), or the receiver front end within receiving path (110). The transmitting path (104) generally includes some filtering and one or more amplifying stages, such as a driver stage and a final power amplifier stage.

Receiving path (110), also within transceiver (102), includes a preselector bandpass filter and a first mixer to provide an IF signal at line (111). The injection filter (112) is a bandpass filter which is commonly used in the known art. Injection switch (114) includes a control terminal (116) for effecting alternate coupling of the output signal from PLL (120) to either injection filter (112) or to transmitting path (104).

PLL (120) includes a reference signal generator comprising reference oscillator (121) and reference divider (122), coupled to a first input (123) of phase detector (124), as shown. Next, a controlled oscillator, including filter (126) and voltage controlled oscillator (VCO) (127), is shown. VCO (127) is modulated by signals applied to its modulation input port, and provides a modulated RF output signal at node (129). A stepped attenuator (128)), having control lines (128A), is coupled to the modulation input port of VCO (127). The VCO output signal appearing at node (129) also couples, via a feedback path, to a programmable divide-by-N divider (130), which has a plurality of binary encoded input lines (130A) used for channel selection by varying the divisor N. The output of programmable divide-by-N (130) couples to a second input (131) of phase detector (124) as shown.

PLL (120) also includes a second stepped attenuator (132), having control lines (132A) and an input fed from summing junction (133). This summing junction (133) has modulation input lines for voice, low frequency (LF) data, and high frequency (HF) data, and two outputs, one feeding stepped attenuator (128) and a second feeding stepped attentuator (132.)

Programmable divide-by-M divider (140) comprises a fully-synchronized programmable frequency divider (142) which has its input coupled to the PLL output node (129) and includes a plurality of input lines (142A), as shown, which are binary-encoded. The modified frequency of the output signal of the PLL appears on line (143). This signal provides either the receive injection signal or the transmitter exciter signal, respectively, for receiving a signal along the receiving path (110) or transmitting along transmitting path (104) in two-way radio (102), as shown in FIG. 1.

In practicing various forms of the present invention, changing the value of the output divisor (M) will cause a corresponding change in the channel spacing and also in the deviation of the frequency modulation (FM) in the output signal, unless this effect is compensated for, or adjusted out. This effect may be better understood by considering the following equation:

$$FREQ = (N/M) \times (f\ REF'), \text{ where } (REF') \times [(f\ REF)/R].$$

Normally, channel spacing is determined by the reference frequency (f REF'). In the present context, however, channel spacing is determined not only by this (f REF'), but also by the effect the output divisor (M) has on the output signal.

In practicing one form of the present invention, reference divider (122) is made variable by comprising a fully synchronized, programmable divider, having a variable (R) made adjustable by a plurality of input lines (122A), which are binary-encoded. This variable (R) changes the reference frequency (f REF') to effectively compensate for any change in the output divisor (M) so that a consistent channel spacing is maintained at the output. The table in Example 1, to be addressed shortly, summarizes this effect, showing that the reference frequency (f REF') is made to track the output divisor (M) for a given VCO center frequency (F VCO).

In practicing another form of the present invention, the reference divider is held fixed at a constant divisor value (R), in order to provide a fixed reference frequency, (f REF'). The table in Example 2, to be addressed shortly, fixes a value of the divisor (R) such that the reference divider provides a fixed (f REF') of 5 kHz, while changes to values of (N) and VCO center frequency (F VCO) effectively compensate for any change in output divisor (M) so that a consistent channel spacing is maintained at the output.

Clearly, in the receive mode, that is all that is required. In each of the above embodiments when in the transmit mode, stepped attenuators (128) and (132) are adjusted to maintain a given maximum deviation of the PLL when modulated by various message signals, including voice and data. The data may be in the form of LF data (such as sub-audible tones), or HF data (such as high speed digital data), or both. To support transmission, then, there are several considerations that need to be addressed.

The first consideration involves setting the appropriate amount of deviation in view of the output divisor (M) chosen. For each embodiment, then, the modulation sensitivity of the VCO must be adjusted via attenuator (128) depending on a ratio of (M)old/(M)new.

The second consideration involves balancing the effects of two inherently different modulation responses. That is, a highpass frequency response characteristic comes about by modulating the VCO (127) from attenuator (128), while a lowpass characteristic comes about by modulating the reference oscillator (121) from attenuator (132). Hence, adjustments to the two attenuators (128) and (132) are needed to balance, or flatten out, the effect of two different frequency response characteristics arising from modulating the PLL at two different modulation input ports. Of course, although the two modulation input ports are driven by an instantaneous deviation control, or modulation limiter, circuit (not shown), these two attenuators facilitate adjustment of the modulating signal so that a maximum allowable deviation is not exceeded.

Programmable divide-by-R divider (122) provides for adjustment of the reference frequency (f REF') applied to the first input (123) of phase detector (124), as shown. If it is implemented according to the first embodiment, it comprises a fully synchronized, programmable frequency divider, and divider (130) is then implemented utilizing a conventional divider.

Programmable divide-by-N divider (130) provides for channel selection by varying the signal frequency division ratio along the feedback path for presentation to the second input (131) of phase detector (124), as shown. If it is implemented according to the second embodiment, then it comprises a fully synchronized, programmable frequency divider, and divider (122) is therefore implemented utilizing a conventional divider.

Channel selection is effected in any of various known ways by controlling the integer divisor for the divide-by-N divider (130) at control lines (130A). The changing of frequency range, or band, is effected by controlling each of lines (122A), (128A), and (142A) to maintain the desired operating frequency, channel spacing, and maximum frequency modulation (FM) deviation for a given band of operation. These parameters can be controlled by various means, including hardware circuit arrangements or software driven instructions for a microcontroller in the two-way radio, if so equipped. The details of how to control these parameters will be discussed next, in conjunction with the spectral diagrams of FIG. 2, by way of several examples which follow.

Referring now to FIG. 2, several simplified frequency spectral diagrams are depicted at (200). These diagrams show how electronic bandswitching is effected by modifying the output frequency from the PLL VCO. FIG. 2A shows a preferred VCO output frequency, namely 450 MHz, represented by spectral line (202) and available at output node (129), as depicted in FIG. 1.

Figure 2A:
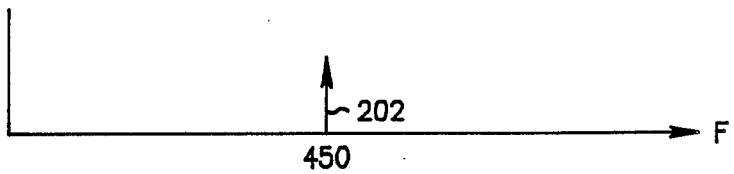
FIG. 2, consisting of 2A, 2B, 2C, and 2D, depicts simplified frequency spectral diagrams portraying the frequency translation, or bandswitching, provided by the arrangement depicted in FIG. 1.
Figure 2B:
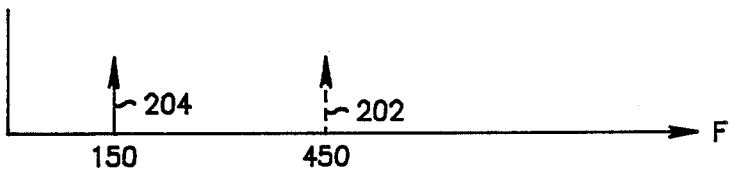

FIG. 2B depicts how the output frequency represented by (202) is shifted to an integer-related lower frequency (204), in the vicinity of 150 MHz, for a divisor M=3. Such an arrangement is useful for providing a two-way mobile radio operating at frequencies in the range of high-band, or VHF, channels.

Figure 2C:
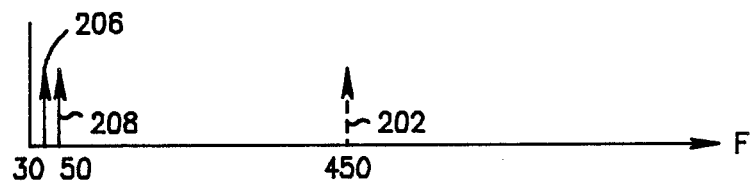

In similar fashion, FIG. 2C depicts a frequency dividing arrangement suitable for low-band, or HF, channels falling between 30 and 50 MHz. Thus, the VCO output frequency represented by (202) is modified by divisor M=15 for a frequency of 30 MHz (represented by (206)) and is divided by divisor M=9 for a frequency of 50 MHz (represented by (208)), as shown.

Figure 2D:
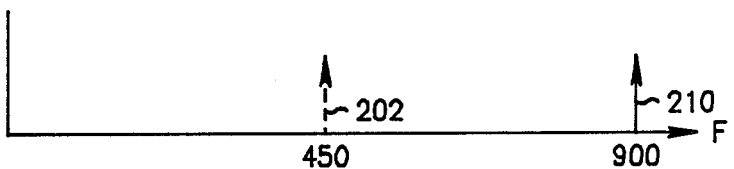

The difficulty of achieving coverage of this wide range of frequencies, namely 30-50 MHz, by conventional methods has already been discussed in the background. However, by not relying on complex VCO designs or conventional programmable dividers, the overall objectives can be readily achieved. As a result, a simplified VCO design is possible, and a more flexible solution is achieved in that a "standardized" VCO may be constructed. Then, operation on the specific band is effected by choosing the appropriate divisor or divisors in one or more of the fully synchronized programmable dividers. Such an arrangement lends itself to modular approaches, including operation at a higher range of frequencies. Thus, communications frequencies in the vicinity of 900 MHz can be accommodated when a multiplier (a doubler) is utilized in place of a divider at the output of the PLL. As FIG. 2D shows, the VCO output frequency of 450 MHz (represented by (202)) is doubled to provide an injection (or transmit) signal at approximately 900 MHz, as represented by (210).

Consequently, the arrangement depicted in FIG. 1 provides a number of advantages resulting from the simplifications embodied therein. These advantages will now be explained by way of several examples, utilizing the frequency spectral diagram of FIG. 2C, and taken in conjunction with FIG. 1.

In Example 1, for a PLL in a radio having a reference oscillator frequency of 25.200 MHz and a VCO frequency of approximately 450.00 MHz, channels in the frequency band of 30-50 MHz are covered as shown below.

EXAMPLE 1:

| f REF | R | f REF' | F VCO | M | FREQ | f CH SP |
|---|---|---|---|---|---|---|
| 25.20 | 2800 | 9 KHz | 450.00 | 9 | 50.00 | 1 KHz |
| 25.20 | 2520 | 10 KHz | 450.00 | 10 | 45.00 | 1 KHz |
| 25.20 | 2100 | 12 KHz | 450.00 | 12 | 37.50 | 1 KHz |
| 25.20 | 1680 | 15 KHz | 450.00 | 15 | 30.00 | 1 KHz |

This example shows that, in order to maintain a given output signal channel spacing (here=1 KHz), the reference divider's divisor (R) must be changed in a manner corresponding to the change in divisor for the output divider, (M). Note that a change in the divisor (M) also affects the frequency modulated output signal appearing at (148), and thus the modulation sensitivity of the VCO must also be changed accordingly to maintain a constant value of deviation. The VCO modulation adjustment is effected by attenuator (128), since the modulation sensitivity at 50 MHz needs to be (3/5) lower than that at 30 MHz, due to the ratio (9/15) for the respective values of (M) given in (M)old/(M)new.

In Example 2, the divisor (N) and the VCO frequency are allowed to vary, while the divisor (R) is held fixed (in this case at a value of 5040), yielding a constant (f REF')

EXAMPLE 2:

| f REF | f REF' | F VCO | M | FREQ | N | f CH SP |
|---|---|---|---|---|---|---|
| 25.20 | 5 kHz | 450 MHz | 9 | 50 MHz | 90,000 | 5 kHz |
| 25.20 | 5 kHz | 480 MHz | 10 | 48 MHz | 96,000 | 5 kHz |
| 25.20 | 5 kHz | 473 MHz | 11 | 43 MHz | 94,600 | 5 kHz |
| 25.20 | 5 kHz | 480 MHz | 12 | 40 MHz | 96,000 | .5 kHz |
| 25.20 | 5 kHz | 481 MHz | 13 | 37 MHz | 96,200 | 5 kHz |
| 25.20 | 5 kHz | 476 MHz | 14 | 34 MHz | 95,200 | 5 kHz |
| 25.20 | 5 kHz | 480 MHz | 15 | 32 MHz | 96,000 | 5 kHz |
| 25.20 | 5 kHz | 450 MHz | 15 | 30 MHz | 90,000 | 5 kHz |

This example shows that a constant channel spacing for the output signal is maintained, while (N) and (F VCO) vary. Note that a change in the divisor (M) affects the FM output signal appearing at (148). The VCO modulation sensitivity must be changed to maintain a constant value of deviation. This is effectively accomplished by attenuator (128), which adjusts the modulation sensitivity at 50 MHz to be (3/5) lower than that at 30 MHz, due to the ratio (9/15) for the respective values of (M). A similar adjustment must be made to attenuator (132) to track this change.

Note also that for incremental changes in channel assignment, such as to 30.005 MHz, the next higher channel above that given for 30 MHz in the table, the following relation holds:

$$(N + 1) = \frac{[30.005 \text{ MHz}] \times [15]}{5 \text{ KHz}} = \frac{450.075 \text{ MHz}}{5 \text{ KHz}} = 90,015$$

Example 3 is generally similar to Example 1 but provides a different approach by using a VCO having a frequency of 150 MHz, instead of 450 MHz, with channels spaced 10 KHz apart:

EXAMPLE 3:

| f REF | R | f REF' | F VCO | M | FREQ | f CH SP |
|---|---|---|---|---|---|---|
| 25.20 | 840 | 30 KHz | 150.00 | 3 | 50.00 | 10 KHz |
| 25.20 | 630 | 40 KHz | 150.00 | 4 | 37.50 | 10 KHz |
| 25.20 | 504 | 50 KHz | 150.00 | 5 | 30.00 | 10 KHz |

A result that occurs in all of the above examples is a dB-for-dB improvement in the sideband noise of the output signal as the divisor (M) increases. This effectively improves the performance at lower frequencies.

Finally, since the output of the programmable output divider (M) is utilized for the receiver injection signal in each of the above examples, it is desirable to minimize the harmonic content of the output waveform while maximizing the energy at the fundamental frequency. Thus, to the extent that an exact 50% duty cycle square wave is achieved at the output (143) of output divider (140), the second harmonic (and higher even harmonics) will be minimized. That is, the next higher harmonic of any significance above the fundamental frequency will be the third harmonic, having energy at about 10 dB below the fundamental. Consequently, this makes the design requirements of a filter, such as the injection filter (112), considerably simpler. As a result, injection filter (112) need only be a bandpass filter with attenuation chosen for good mixer performance. Generally, then, no additional harmonic filtering is needed at the output of programmable divider (140), since the attenuation in the injection filter at the third harmonic is sufficient. For example, given a 3 pole, 0.1 dB ripple filter that is 20 MHz wide, it would offer at worst case about 20 dB of attenuation at 90 MHz when operating at a fundamental frequency equal to 30 MHz.

The apparatus and arrangement of the present invention embodied in FIG. 1 facilitates electronic band-switching with low noise and fast switching speed due to the fact that the fully synchronized programmable frequency divider utilized herein provides a fully synchronized output signal that has a 50% duty cycle and synchronous data loading of new values of integers for the divisor therein, regardless of whether the selected integer used is even or odd. Thus, the arrangement disclosed herein represents a significant improvement over the known art because, among other advantages, it does not degrade switching speed and sideband noise performance of the VCO. In fact, the sideband noise performance of the VCO is effectively improved dB-for-dB as the divisor increases in magnitude, which is a clear advantage over the cited art.

We claim:

1. A radio comprising:
   transmitter means for transmitting an RF signal;
   means for receiving an RF signal;
   frequency synthesizing means for providing a plurality of frequencies, said frequency synthesizing means including means for adjusting modulation when said transmitter means is transmitting; and
   synchronized dividing means, including half-period detecting means for detecting an integer-approximated half-period of a signal provided by the frequency synthesizing means, for synchronously frequency dividing the signal from said frequency synthesizing means by a divisor to provide an output signal to said transmitter means or receiver means having a duty cycle, nearly equal to 50%, which is substantially independent of the divisor.

2. The radio according to claim 1, wherein said receiving means includes at least one receiver having wide-bandwidth frequency coverage encompassing at least two frequency bands.

3. The radio according to claim 1, wherein said transmitting means comprises a transmitter including a single transmitting path having wide-bandwidth frequency coverage encompassing at least two frequency bands.

4. The radio according to claim 1, wherein said transmitting means comprises a transmitter including a plurality of transmitting paths, one for each frequency band.

5. The radio according to claim 1, wherein said modulation adjusting means comprises at least one stepped attenuator coupled to said frequency synthesizing means for adjusting modulation therein 6. The radio according to claim 1, wherein said frequency synthesizing means comprises a PLL including at least:
   (A) reference signal generating means;
   (B) a phase detector having first and second inputs, the first input coupled to said generating means; and
   (C) controlled oscillating means, having an input coupled to said phase detector, and an output coupled, via a feedback path, to the second input of said phase detector, for providing a controlled oscillator signal.

7. The radio according to claim 6, wherein said reference signal generating means includes a reference oscillator and a fixed reference divider coupled thereto so as to provide a fixed reference frequency which establishes a fixed channel spacing for the PLL.

8. The radio according to claim 6, wherein said reference signal generating means includes an oscillator and a fully synchronized programmable frequency divider coupled thereto so as to provide a variable reference frequency which establishes a desired channel spacing for the PLL by modifying a divisor R therein.

9. The radio according to claim 6, wherein said controlled oscillating means includes a loop filter coupled to a voltage controlled oscillator, and said feedback path includes a fully programmable frequency divider so as to select a desired channel by modifying a divisor N in said PLL.

10. The radio according to claim 1, wherein said modulation adjusting means includes a first stepped attenuator for adjusting a value of deviation having a highpass characteristic caused by modulating said controlled oscillating means, and a second stepped attenuator for adjusting a value of deviation having a lowpass characteristic caused by modulating said reference signal generating means.

11. A radio having multi-band capability and exhibiting fast-locking, low-noise characteristics, comprising:
   (A) a transceiver including at least one transmitter and at least one receiver;
      (i) a reference signal generator having a first stepped attenuator coupled thereto which adjusts a modulated reference signal generated therein;
      (ii) a phase detector having first and second inputs, with said first input coupled to said reference signal generator;
      (iii) a modulated VCO, having a first input coupled to said phase detector through a loop filter, a second input coupled to an included second stepped attenuator, and an output coupled via a feedback path to the second input of said phase detector;
      (iv) a programmable divide-by-N divider in the feedback path; and
   (C) a fully synchronized, programmable frequency divider, coupled between said transceiver and said PLL, and including half-period detecting means for detecting an integer-approximated half-period of a signal provided by the VCO, for providing a frequency divided outupt signal having a duty cycle, nearly equal to 50%, which is independent of a divisor M therein to minimize the harmonic energy therefrom, said fully synchronized, programmable frequency divider providing electronic bandswitching for a two-way radio so as to exhibit fast-locking and lownoise characteristics, and said stepped attenuators adjusting the amount of deviation when in the transmit mode so as to compensate for a change in the divisor M.

12. A radio having a multi-band capability and exhibiting fast-locking, low-noise characteristics, comprising:

(A) a transceiver including a least one transmitter and at least one receiver;

(B) a PLL, including at least:
  (i) a reference signal generator having a first stepped attenuator coupled thereto which adjusts a modulated reference signal generated therein;
  (ii) a phase detector having first and second inputs, with said first input coupled to said reference signal generator;
  (iii) a modulated VCO, having a first input coupled to said phase detector through a loop filter, a second input coupled to an included second stepped attenuator, and an output coupled via a feedback path to the second input of said phase detector;
  (iv) a programmable divide-by-N divider in the feedback path; and (C) a fully synchronized, programmable frequency divider, coupled between said transceiver and said PLL frequency divider, and including half-period detecting means for detecting an integer-approximated half-period of a signal provided by the VCO for providing a frequency divided output signal having a duty cycle, substantially equal to 50%, which is independent of a divisor M therein to minimize the harmonic energy therefrom, said fully synchronized, programmable frequency divider providing electronic bandswitching for a two-way radio so as to exhibit fast-locking and lownoise characteristics, and said stepped attenuators adjusting the amount of deviation when in the transmit mode so as to compensate for a change in the divisor M.

13. A method for effecting electronic bandswitching in a radio having a PLL and an included receiver therein, the method comprising the steps of:

(A) changing a divisor from a first to a second integer in an output divider including half-period detecting means for detecting an integer-approximated half-period of a signal provided by the PLL and which provides an output signal therefrom having a duty cycle nearly equal to 50%; and (B) changing at least one other divisor in the PLL, so as to maintain a constant channel spacing at the output of the output divider;

(C) adjusting modulation by changing values of attenuation in first and second stepped attenuators included within the PLL in synchronism with, and dependent on, the change made in step (A0 in a manner so as to keep the value of deviation within a predetermined maximum and to effect balance of different frequency responses so induced, thereby effecting electronic bandswitching for the radio in the transmit mode while exhibiting fast-locking and low-noise characteristics.

14. The method according to claim 13, wherein said other divisor includes a divisor in either of an included divide-by-R reference divider or an included divide-by-N channel selection divider.

15. The method according to claim 13, wherein said step of adjusting modulation includes changing modulation sensitivity by a ratio defined by the second integer divided by the first integer of step (A).

* * * * *

UNITED STATES PATENT AND TRADEMARK OFFICE
CERTIFICATE OF CORRECTION

PATENT NO. : 4,969,210
DATED : November 6, 1990
INVENTOR(S) : Kenneth A. Hansen, et al It is certified that error appears in the above-identified patent and that said Letters Patent is hereby corrected as shown below:

Column 10, line 25, delete "0" and insert therefor -- ) --.

Signed and Sealed this

Twenty-fourth Day of November, 1992

*Attest:*

DOUGLAS B. COMER

*Attesting Officer*  *Acting Commissioner of Patents and Trademarks*